United States Patent [19]

Feuerbaum

[11] 4,277,679
[45] Jul. 7, 1981

[54] APPARATUS AND METHOD FOR CONTACT-FREE POTENTIAL MEASUREMENTS OF AN ELECTRONIC COMPOSITION

[75] Inventor: Hans P. Feuerbaum, Munich, Fed. Rep. of Germany

[73] Assignee: Siemens Aktiengesellschaft, Berlin & Munich, Fed. Rep. of Germany

[21] Appl. No.: 105,892

[22] Filed: Dec. 21, 1979

[30] Foreign Application Priority Data

Jan. 26, 1979 [DE] Fed. Rep. of Germany ....... 2903077

[51] Int. Cl.³ .......................................... G01N 23/00
[52] U.S. Cl. ................................. 250/310; 324/158 D
[58] Field of Search ............... 250/306, 309, 310, 311, 250/397, 305; 324/158 D

[56] References Cited

U.S. PATENT DOCUMENTS

| | | | |
|---|---|---|---|
| 3,714,424 | 1/1973 | Weber | 250/310 |
| 4,172,228 | 10/1979 | Gauthier et al. | 250/310 |
| 4,179,604 | 12/1979 | Christou | 250/310 |
| 4,220,853 | 9/1980 | Feuerbaum et al. | 250/310 |
| 4,220,854 | 9/1980 | Feuerbaum | 250/310 |
| 4,223,220 | 9/1980 | Feuerbaum | 250/310 |

OTHER PUBLICATIONS

"Application of Electron Beam Measuring Techniques for Verification of Computer Simulations for Large-Scale Integrated Circuits," Feuerbaum et al., *Scanning Electron Microscopy*, vol. 1, 1978, pp. 795-800.

*Primary Examiner*—Bruce C. Anderson
*Attorney, Agent, or Firm*—Hill, Van Santen, Steadman, Chiara & Simpson

[57] ABSTRACT

A method and apparatus for the contact-free potential measurement at an electronic component using an electron beam wherein a predetermined potential is applied to the measuring point and the output voltage of a controlled gain amplifier is set to a predetermined reference value $U_S$ by means of controlling a photomultiplier voltage $U_{PM}$ and the photomultiplier voltage $U_{PM}$ is maintained constant. The measuring voltage $U_M$ is then determined from the difference of the voltages $U_R - U_S$ between the control unit output voltage $U_R$ and the index value voltage $U_S$. The method and apparatus allow the quantitative potential measurement to be made on the conducting paths of an integrated circuit without utilizing manual adjustments.

7 Claims, 1 Drawing Figure

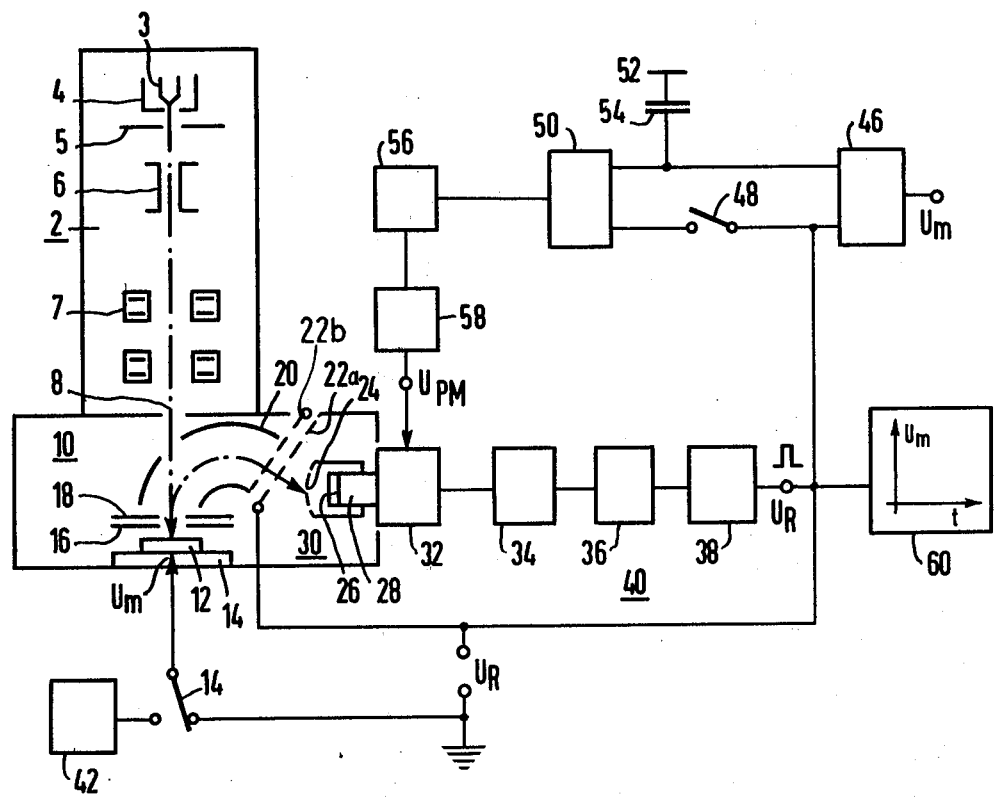

APPARATUS AND METHOD FOR CONTACT-FREE POTENTIAL MEASUREMENTS OF AN ELECTRONIC COMPOSITION

BACKGROUND OF THE INVENTION

1. Field of the Invention

This invention relates in general to method and apparatus for the contact-free potential measurement of an electronic component, preferably an integrated circuit, using an electron microscope wherein the energy of secondary electrons are measured with a spectrometer and in which a compensating circuit having a controlled-gain amplifier is arranged in circuit with the photomultiplier.

2. Description of the Prior Art

It is known that the potential on paths of an electronic component such as an integrated circuit can be measured with an electron microscope, particularly with a scanning electron microscope, in which the primary electron beam releases secondary electrons at the measuring location and the energy of the secondary electrons are determined by the potential at the measuring location. For energy measurements, a spectrometer, particularly an retarding field spectrometer, is utilized which contains a deflection capacitor which supplies the secondary electrons to an electron collector through an retarding field, a photomultiplier and a controlled gain amplifier which is connected to the electron collector. With the use of a compensating feedback loop circuit the output voltage of the controlled gain amplifier drives the retarding field of the spectrometer and maintains the grid voltage constant with reference to the voltage of the measuring location of the component. The grid voltage at the retarding field electrode of the spectrometer is adjusted until the voltage between the grid and measuring point reaches its original value. The change of the grid voltage then determines the potential change at the measuring location of the component which is the test object as described in the article "Scanning Electron Microscope" 1978, Volume I, SEM Inc., AMF O'hare Illinois 60666, USA, Pages 795 through 800.

In these known devices the operating voltage is applied to the component and the control clock pulses are supplied by a control clock unit circuit. By changing the photomultiplier voltage, a desirable operating point for the control loop which consists of the spectrometer and the photomultiplier as well as the preamplifier and controlled gain amplifier can be set according to the signal/potential characteristics of the control loop. The setting of this operating point is accomplished manually in the prior art devices.

SUMMARY OF THE INVENTION

The present invention discloses the automatic setting and maintaining of the control loop by automatically setting the operating point as well as automatically accomplishing the potential measurements.

The object of the invention is achieved by providing that a measuring point of the component receives a predetermined potential and the output voltage of the controlled gain amplifier is set to a predetermined index value by way of the photomultiplier voltage. The photomultiplier voltage is then maintained constant and subsequently the operating voltage is applied to the component. The measured voltage is obtained from the difference between the regulator output voltage and the index value voltage. For setting the operating point, the measuring point of the component can preferably be applied with zero potential. It is expeditious that all other connections of the component also receives zero potential at the same time.

In a particular simple embodiment of the invention, the photomultiplier control has a comparator connected to it and the output signal of the controlled gain amplifier and an index value voltage are supplied to the comparator. The output voltage of the comparator is supplied to control the photomultiplier voltage and adjusted until the output signal of the controlled gain amplifier is equal to the index value voltage. The photomultiplier control is provided with a means which then holds the photomultiplier voltage constant at this predetermined value. The comparator is then disconnected and the operating voltage is applied to the component and the index value voltage together with the output voltage of the controlled gain amplifier are supplied to a differential amplifier which supplies the voltage at the measuring location as the output signal.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

BRIEF DESCRIPTION OF THE DRAWINGS

The FIGURE illustrates an electrical schematic diagram of the invention.

DESCRIPTION OF THE PREFERRED EMBODIMENTS

The FIGURE illustrates an electron optical column 2 of an electron microscope which can preferably be a scanning electron microscope. A test chamber 10 is mounted so as to intercept the electron beam 8 of the electron microscope and an electronic component 12 as, for example, an integrated circuit is mounted on base 14. The electron beam 8 causes secondary electrons to be emitted from the component 12 which pass as shown by the dash-dot arrow to a scintillator of a spectrometer 30. The electron optical column 2 incudes an electron gun having a cathode 3 as well as a modulator electrode 4 and an anode 5. A beam keying system 6 as well as a deflection system for the primary electron beam 8 which passes into the test chamber 10 through an aperture are also provided. The secondary electrons caused by the electron beam 8 when it impinges on the electron component 12 are deflected by means of the field of a modulator electrode 16 as well as an anode 18 and are deflected to the spectrometer 30 by means including the capacitor 20. The secondary electrons are deflected to the electron collector of the spectrometer and pass through the retarding field of two opposing field electrodes 22a and 22b as shown by the dot-dash arrow. Between the screen grid 24 and the scintillator crystal 26 the electron collector there is an acceleration segment to which a high acceleration voltage as, for example, 15 kV volts is applied. The secondary electrons impinge upon the scintillator 26 which emits photons which are supplied through a fiber-optic light guide 28 to a photomultiplier 32 which supplies an output to a sensitive pre-amplifier 34. The output of the pre-amplifier 34 is connected to a comparator 36 which compares the output signal of the pre-amplifier 34 with a predetermined index voltage value. The output of the comparator 36 is supplied to a controlled gain amplifier 38 so as to control its output as a function of the difference of the two input signals to the comparator 36. The controlled gain amplifier 38 produces an output signal $U_R$ which is fed back as a back coupling loop to the grid electrode 22 of the spectrometer 30.

Thus, the spectrometer 30 together with the photomultiplier 32, the pre-amplifier 34, the comparator 36 and the controlled gain amplifier 38 form a compensating circuit 40 for the spectrometer 30.

The component 12 receives a control clock pulse from a controlled unit 42 which can preferably also be coupled to the keying device 6 for the beam of the primary electron beam 8. A change-over switch 44 allows the component 12 to be connected to ground potential by moving its movable contact from engagement with the control unit 42 to the second contact to connect the component 12 to ground. In the FIGURE, switch 44 is connected to ground.

The output signal $U_R$ of the controlled gain amplifier 38 is supplied to a differential amplifier 46 and through a switch 48 to a comparator 50. A presetting means 52 which includes a capacitor 54 allows an index value voltage $U_S$ to be supplied as the second input to the differential amplifier 46 and the comparator 50. The output of the comparator 50 is connected to the input of a photomultiplier control 56 which controls the photomultiplier voltage $U_{PM}$ of the photomultiplier 32 through a main power apparatus 58. The control unit output signal $U_R$ of the controlled gain amplifier 38 is also connected to an oscilloscope 60 which displays on its screen the voltage $U_m$ which comprises the voltage at the measuring point of the component 12 and this voltage can be displayed as a function of time, t.

So as to make a potential measurement, the operating point of the spectrometer 30 is first set. For this purpose, the measuring point of the component 12 is connected by means of the change-over switch 44 to a predetermined potential as, for example, ground potential. It is expedient if all terminals of the component 12 are connected to the ground potential at this time. Then the voltage at the retarding field electrode 22 of the spectrometer 30 is set to a predetermined voltage value by changing the photomultiplier voltage $U_{PM}$ and the predetermined voltage value is derived from the signal/potential characteristic of the spectrometer. The output signal $U_R$ of the controlled gain amplifier 38 is supplied to the comparator 50 through the switch 48. The comparator 50 also receives the index value voltage $U_S$. The photomultiplier control 56 and the main power apparatus 58 allows the output signal of the comparator 50 to control the photomultiplier voltage $U_{PM}$ until the difference between the input signals to the comparator 50 is zero at which time, $U_{R1} = U_S$.

The operating point of the spectrometer 30 is thus set and the DC component in the measuring signals $U_m$ can be measured. Then the change-over switch 44 is moved from engagement with ground potential to connect the component 12 to the output of the control unit 42 which supplies control clock pulses to the component 12. The operating voltage is also applied to the component 12 at this time. The photomultiplier control 56 maintains the set value of the photomultiplier $U_{PM}$ at a constant value. For this purpose, a digital memory or an analog memory can be provided. The controlled gain amplifier 38 will supply an output signal $U_R + U_{R1} + U_m$ which increases by the value of the measuring voltage $U_m$ at the measuring point of the component. Thus, the differential amplifier 46 will receive $$U_R - U_S = U_{R1} + U_m - U_S$$

as its input signal. Since the predetermined index voltage value $U_S$ is equal to the control unit output signal $U_{R1}$ at the operating point of the spectrometer 30, the measuring voltage $U_m$ will be obtained at the output of the differential amplifier 46. This will be equal to $$U_R - U_S = U_m$$

Thus, with the invention illustrated by presetting the index voltage $U_S$ the necessary setting of the operating point of the spectrometer 30 is first automatically obtained and subsequently, the sequence of the steps for determining the measured voltage $U_m$ at the measuring point of the component 12 will be automatically adjusted.

Although the invention has been described with respect to preferred embodiments, it is not to be so limited as changes and modifications may be made which are within the full intended scope as defined by the appended claims.

I claim as my invention:

1. A method for contact-free potential measurement of an electronic component with an electron microscope by means of measuring the energy of the secondary electrons with a spectrometer having a compensating circuit with a controlled-gain amplifier and to which a photomultiplier is connected, comprising the steps of connecting the measuring point of the component (12) to a pre-determined potential; and setting the output voltage ($U_{R1}$) of the controlled-gain amplifier (38) to a pre-determined index value ($U_S$) with the control of the photomultiplier voltage ($U_{PM}$); and holding the photomultiplier voltage ($U_{PM}$) constant and, subsequently applying an operating voltage to the component (12) and determining the measured voltage ($U_m$) from the difference ($U_R - U_S$) between the control unit output voltage ($U_R$) and the index value ($U_S$).

2. A method according to claim 1, characterized in that the measuring point of the component (12) is connected to zero potential during the first step.

3. Apparatus for contact-free measurement of an electronic component with an electron microscope and measuring the energy of secondary electrons with a scintillator comprising, means for connecting a predetermined potential to said component (12); a controlled gain amplifier (38) connected to the photomultiplier (32) of said scintillator (26), a differential amplifier (46) connected to said amplifier (38) and its output supplies the measuring voltage ($U_m$), a comparator (50) which can be switched to receive an input from said amplifier (38) and has a second input comprising an index value voltage ($U_S$) and the output of said comparator (50) connected to control the photomultiplier voltage ($U_{PM}$) of the photomultiplier (32) through a control device (56).

4. Apparatus for contact-free potential measurements of a test sample comprising, an electron microscope mounted to irridate said test sample with an electron beam to produce secondary electron emission, a voltage control unit, a first switch connected to said test sample to connect it to said control voltage unit or a first reference fixed potential, a scintillator mounted to receive said secondary electron emission, a retarding field electrode mounted between said test sample and said scintillator, a photomultiplier tube connected to said scintillator, a controlled-gain amplifier connected to said photomultiplier tube and supplying an input to said retarding field electrode, a differential amplifier receiving the output of said controlled-gain amplifier, a second switch connected to said controlled gain amplifier, a comparator connected to said second switch, a second reference potential connected to said differential amplifier and to said comparator, and the output of said comparator connected to control said photomultiplier tube.

5. Apparatus according to claim 4 wherein said first reference fixed potential is ground.

6. Apparatus according to claim 4 including an oscilloscope connected to the output of said controlled gain amplifier.

7. Apparatus according to claim 4 wherein a photomultiplier control unit is connected between said comparator and said photomultiplier tube.